United States Patent [19]

Noguchi et al.

[11] Patent Number: 4,841,228

[45] Date of Patent: Jun. 20, 1989

[54] APPARATUS FOR INDICATING THE RESISTIVE CHARACTERISTIC OF A CAPACITOR

[75] Inventors: Hitoshi Noguchi; Hideki Wakamatsu, both of Tokyo, Japan

[73] Assignee: Hewlett-Packard Company, Palo Alto, Calif.

[21] Appl. No.: 72,070

[22] Filed: Jul. 10, 1987

[30] Foreign Application Priority Data

Jul. 11, 1986 [JP] Japan .................................. 61-163444

[51] Int. Cl.$^4$ ............................................. G01R 27/26
[52] U.S. Cl. ................................... 324/62; 324/57 R; 324/60 R; 324/548
[58] Field of Search ...................... 324/60 R, 60 C, 62, 324/57 R, 63, 548; 364/550, 571

[56] References Cited

U.S. PATENT DOCUMENTS

| | | | |
|---|---|---|---|
| 3,562,641 | 2/1971 | Fulks | 324/99 D X |
| 3,713,022 | 1/1973 | McRay | 324/60 C |
| 3,896,374 | 1/1975 | Delafon | 324/60 C |
| 3,970,925 | 7/1976 | Procter et al. | 324/60 R X |
| 4,272,718 | 6/1981 | Kashiuchi et al. | 324/60 C X |
| 4,772,844 | 9/1988 | Andeen et al. | 324/60 C X |
| 4,926,616 | 1/1984 | Maier | 324/60 C X |

OTHER PUBLICATIONS

Cutkosky, "An Automatic High-Precision Audiofrequency Capacitance Bridge", IEEE Transactions on Instrumentation and Measurement, vol. IM-34, No. 3, Sep. 1985, pp. 383-389.

Primary Examiner—Reinhard J. Eisenzopf
Assistant Examiner—Warren S. Edmonds
Attorney, Agent, or Firm—Donald N. Timbie

[57] ABSTRACT

Current passing through a capacitor being measured is combined with programmable portions of oppositely phased current, and means are provided for deriving voltages from said combined current that lie within a given range regardless of the capacitance of the capacitor under test. A phase detector determines the phase angle between the latter voltage and the voltage causing current flow through the capacitor. The means for deriving the out-of-phase current includes a plurality of programmable, current transducer having their primary windings connected in series, one end of each secondary winding being connected to one end of its primary winding, and switches respectively connected to the other under the secondary winding. The means for deriving the voltage referred includes an operational amplifier and switches for connecting a similar plurality of current transformers in series with the capacitor being measured as in the feedback of the amplifier.

5 Claims, 3 Drawing Sheets

APPARATUS FOR INDICATING THE RESISTIVE CHARACTERISTIC OF A CAPACITOR

BACKGROUND OF THE INVENTION

One electric component measurement apparatus has been disclosed in Japanese Patent, Laid-Open No. 63373/1977, that was filed for thee present applicant. This measurement apparatus determines the resistance of a capacitor by converting current flowing through it ito a voltage and phase detecting the voltage output. Generally speaking, however, the resistance is far smaller than the capacitance. Therefore, if this resistance and capacitance are to be measured by the same circuit e.g., a phase detector, the accuracy of the measurement of the resistance cannot be improved in dependence upon the angular error of the phase detector. Moreover, since the phase detector has a limited dynamic range, the measurement cannot be highly accurate for a widely different values of capacitance.

One apparatus for measuring the resistance of a capacitor is shown in FIG. 1. This measurement apparatus uses a circuit 41 for cancelling or offsetting capacitance that is comprised of a variable voltage divider 42, a phase shifting capacitor 43 and an inverting amplifier 44 connected in series between a source 40 of a voltage V and the inverting input of an operational amplifier 46. A capacitor 45 having a loss resistance Gx to be measured is connected between the source 40 and the inverting input of the operational amplifier 46 so that a current ($i_{CX}=WCxV$ and $i_{GX}=V/Gx$) that flows through the capacitor 45 is converted into a voltage by one of a plurality of range resistors 47 that is connected between the inverting input of the operational amplifier 46 and its output. The output is applied to a vector voltage ratio meter 49. The circuit 41 absorbs or cancels some of the current flowing through the capcity Cx of the capacitor 45. The resistance Gx is obtained by the phase detection in the vector voltage ratio meter 49, and the capacitance Cx is determined by adding the capacitance obtained by the phase detection of the vector voltage ratio meter 49 and the set value resulting from the setting of the variable voltage divider 42 in the offset circuit 41.

In case, however, the value of the capacitor varies over a considerable range, e.g., 1 pF to 2,048 pF, the measurement apparatus has found it difficult to absorb or cancel the current component $i_{CX}$ throughout that range, especially where the capacitance and the current component $i_{CX}$ are high, so that an unabsorbed or uncancelled component of $i_{CX}$ flows through the range resistor 47. Although the resistance of the range resistor 47 can be varied in accordance with the magnitude of the current component $i_{CX}$, the resolution of the offset circuit 41 is a 1 pF step within a large capacitance range, e.g, 1 to 2,048 pf so as to make it difficult to absorb or cancel the current component $i_{CX}$ with the same resolution for different magnitudes of the capacitance Cx. This is because the variable voltage divider 42 in the offset circuit 41 is a transformer, as will be described hereinafter, thereby making it difficult to obtain step exceeding 1pF.

This makes it difficult for this measurement apparatus to expand and transmit the loss angle to the vector voltage ratio meter equally over the whole measurement capacitance range so that the measurement apparatus has failed to measure the loss with accuracy.

FIG. 2 is a circuit diagram showing the variable voltage divider 42 in the capacitance offset or cancellation circuit 41 shown in FIG. 4. A transformer 51 has a number of secondary windings, with respective turns ratios of $(\frac{1}{2})^n$ so as to generate a desired voltage $V_0$ in accordance with the connected position or the programmed value, of one of n switches, only four of which, 52-56 are shown. In order to generate a voltage of $\frac{1}{8}V$, for example, only the switch 53 is connected at its side a whereas the remaining switches are connected at their sides b.

In this variable voltage divider 42, however, the characteristics of the transformer 51 a viewed from the input side change with the switch that is closed so as to degrade the linearity between the switch closed and the voltage dividing ratio. Therefore, a correction impedance 57 is used. This complicates the circuit structure. Another defect is that the resolution $(\frac{1}{2})^n$ cannot be greatly increased.

BRIEF SUMMARY OF THE INVENTION

The present invention eliminates the above-specified defects and provides an electric component measurement apparatus which uses simple structure to measure the resistance of a capacitor with high accuracy.

The improved apparatus provides an electric component measurement apparatus which can measure the resistance of a capacitor by standardizing the current that flows through the capacitor even if the capacitance of the capacitor varies over a wide range, by absorbing the standardized current with an identical resolution over the whole range, and by expanding a loss angle due to the loss resistance of the capacitor and feeding it to a voltage ratio meter.

The current flowing through the capacitor to be measured is fed via a binary programmable current transformer that operates as a current divider or as a current multiplier and is standardized so as to provide an appropriate current to a vector voltage ratio meter. Both the programmable current divider and the current multiplier have identical structures and are switched in accordance with the capacitance value of the capacitor. In the capacitance offset circuit, a programmable current transformer is used which has the same structure as that of the aforementioned programmable current transformer. The latter current transformer is switched so as to have such a value as to substantially cancel the standardized current.

DETAILED DESCRIPTION OF THE INVENTION

Figure 3:
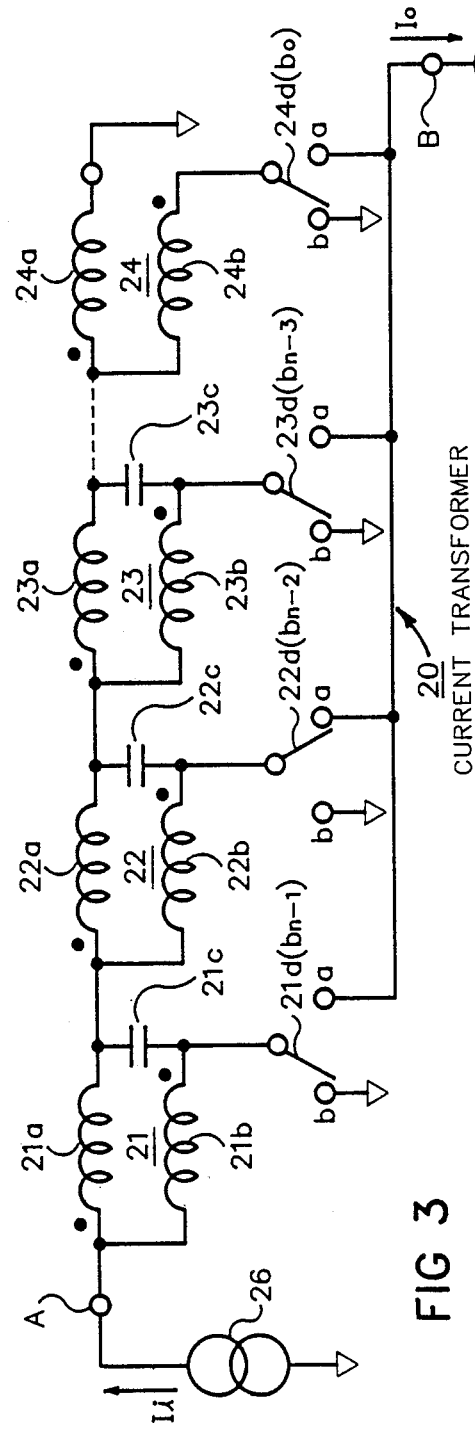
FIG. 3 is a schematic diagram of a programmable transformer used in this invention.

FIG. 3 is a diagram showing a programmable current transformer 20 in which reference numerals 21 to 24 designate transformers which have primary and secondary windings respectively connected at one end. The ratio between the numbers of turns of the windings 21a and 21b, 22a and 22b, 23a and 23b and 24a and 24b is 1:1, and their polarities are opposite from each other, as indicated at symbol (.) in the drawing. The other ends of individual windings 21b through 24b are connected with movable arms of change-over switches 21d through 24d respectively. The series connected windings 21a through 24a are connected between a current source 26 and ground. One of the fixed contacts of the aforementioned individual change-over switches 21d through 24d is connected directly with ground and the other of the fixed contacts is connected to ground via an ammeter 25. The movable contacts of the aforementioned changeover switches are respectively driven by program control circuits not shown.

In the binary programmable current transformer 20 thus constructed, currents (Ii/2) will flow through the two windings 21a and 21b of the transformer 21 at the initial stage if the current value fed from the current source 26 is designated at Ii. And, currents (Ii/4) will flow through the windings 22a and 22b of the transformer 22 as the next stage, respectively. As a result, in case n transformers are connected in series, a combination of n bits is obtained so that a divided current $$Io = (Ii/2)^n \sum_{i=0}^{m-1} 2^i b_i \ (b_i: 1 \text{ or } 0)$$

is generated at the output ammeter 25 by the combination of the individual changeover switches 21d through 24d. Capacitors 21c through 23c that are respectively connected between the other ends of the windings of the transformers, compensate for the exciting currents flowing through the transformers by making these capacitors and the exciting reactances of the transformers parallel resonant for the input signal source frequency so that equal currents may flow through the individual windings 21a through 24a and 21b through 24b to improve the accuracy.

Figure 4:
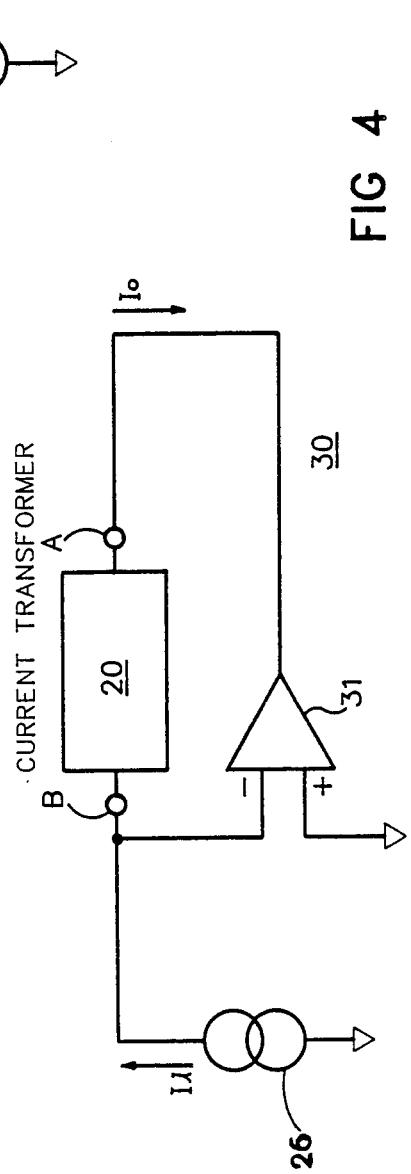
FIG. 4 is a block diagram of a current multiplier.

In FIG. 4, the aforementioned programmable current transformer 20 is inserted into the feedback circuit of an operational amplifier 31 so that it may be used as a current multiplier, and a source 26 of current Ii is connected to the inverting input of the amplifier 31.

The programmable current transformer 20 of FIG. 4 has its input end A connected to the output of the operational amplifier 31 and its output end B connected to the inverting input of the operational amplifier 31. The use of this operational amplifier provides an accurate current multiplier. If, in this case, the total current division ratio of the current transformer 20 is designated at (1/N), the ratio (Io/Ii) of the output current Io to the input current Ii of the current source 26 takes the value (N) i.e., Io=NIi, thus constructing the current multiplier.

Figure 5:
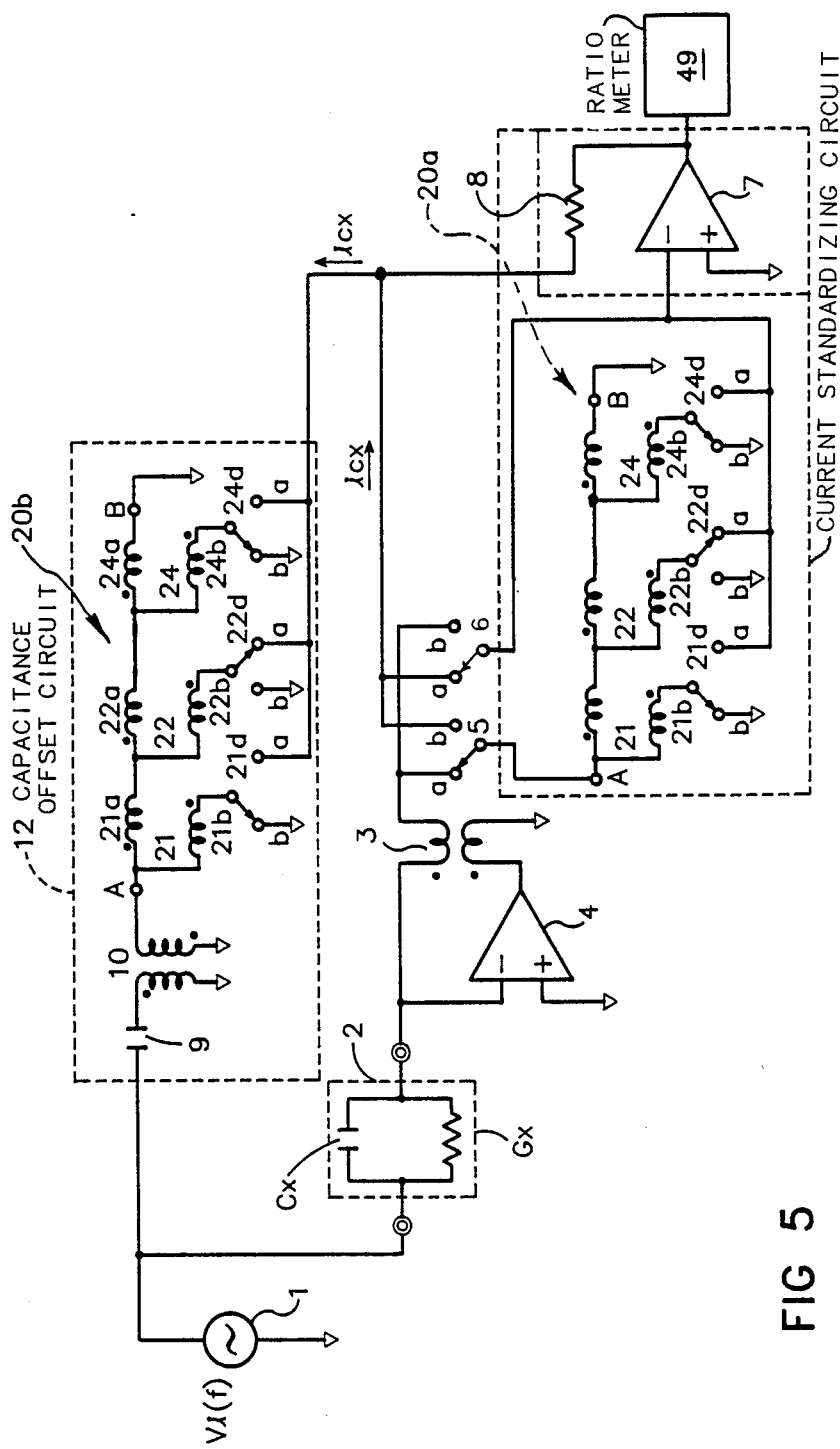
FIG. 5 is a schematic diagram of an embodiment of this invention.

FIG. 5 is a diagram showing an electric component measurement apparatus according to the present invention. The programmable current transformer shown in FIG. 3 is used for standardizing the current flowing through the capacitor 2 and in a capacitance offset circuit 12. A programmable current transformer 20a, i.e, a range current transformer; is connected between the capacitor 2 and the inverting input of an operational amplifier 7 through switches 5 and 6. Here, as is apparent from the descriptions of FIGS. 3 and 4, a current divider is provided if the switches 5 and 6 are connected to the sides a whereas a current multiplier is provided if the same are connected to the sides a b. The circuit comprised of the transformer 3 and the operational amplifier 4 is used to hold one connected terminal of the capacitor 2 at a virtual ground potential so that $-i_{cx}=W_{cx}V_i$ and $i_{Gx}=G_xV_i$ and has no direct relationship to the present invention. The capacitance offset circuit 12 is comprised of a phase shifting capacitor 9 connected with the signal source 1, a polarity inverting transformer 10, a programmable current transformer 20b, the output of which is connected with switches 5 and 6 and a resistor 8. Numeral 49 designates a vector voltage ratio meter.

The circuit of the present invention operates as follows. The description will be made by using specific examples of numerical values so that the operations of the present invention may be better understood. The following numerical values are used: The frequency f of the input signal source is f =1 MHz; the capacitance $C_X$ of the capacitor 2 to be measured is $C_X$=1 to 2,048 pF, i.e., in three decades; and the bit number n of the range and capacitance offset transformers 20a and 20b is n=6. And, it is assumed that the range current transformer 20a can be switched within one of eleven ranges over the range of the afore-mentioned capacitance $C_X$. Specifically, $C_X$=1 to 2 pF in the first ranges; $C_X$=2 to 4 pF in the second range; $C_X$=8 to 16 pF in the fourth range; $C_X$=16 to 32 pF in the fifth range; and $C_X$=1,024 to 2,048 in the eleventh range.

Measurements for $C_X$=1 to 16 pF (Four Ranges)

The switches 5 and 6 are connected with the contact b so that the range current transformer 20a is used as the current multiplier, and four bits are used so that the multiple is interchanged and set in accordance with the magnitude of the capacitance $C_X$, for example, at 2 for 8 to 16 pF, at 16 for 1 to 2 pF. As a result, the output current of the range current transformer 20a is standardized over the four ranges to a current corresponding to 16 to 32 pF. On the other hand, the C-offset current transformer 20b uses six bits and is switched and set to substantially absorb (or cancel) the aforementioned current corresponding to 16 to 32 pF with a resolution of 1/64 over all the ranges. Incidentally, in the tests or the like on the production line, the approximate value of the capacitance $C_X$ is substantially known before the measurement so that the switches of the current transformer 20b are switched and set in accordance with the approximate value.

Measurements for $C_X$=32 to 2,048 pF (Six Ranges)

The switches 5 and 6 are connected with the contact a so that the range current transformer 20a is used as the current divider, and six bits are used so that the multiple is interchanged and set in accordance with the magnitude of the capacitance $C_X$, for example, at ½ for 32 to 64 pF, at 1/64 for 1,024 to 2,048 pF. As a result, the output current of the range current transformer 20a is standardized over the six ranges to a current corresponding to 16 to 32 pF. And, this standardized value is equal to the aforementioned one. As a result, the standardization is made within the identical range over all the ranges. On the other hand, the C-offset current transformer 20b performs the operations like the aforementioned ones to substantially absorb the current $i_{CX}$ over the six ranges with the identical resolution (1/64).

Incidentally, in the range of 16 to 32 pF, neither any current division nor any multiplication is performed, but the current flowing through the capacitor is used as it is.

As has been described hereinbefore, the current divider or the current multiplier is switched and set for use, even if the capacitance $C_X$ is varied over 1 to 2,048 pF, and its outputs is standardized to a capacitance value within a constant range. After this, the resistance is measured. Incidentally, the capacitance $C_X$ is determined from the output of the vector voltage ratio meter 49 and the set value of the capacitance—offset current transformer 20b and the resistance $G_X$ is determined from the output of the vector voltage ratio meter 49 and the set value of the range current transformer 20a. A loss coefficient D is determined from the frequency of the signal source and the values $C_X$ and $G_X$.

The description thus far made exemplifies the programmable current transformer and the current multiplier of binary notation. It is known to those skilled in the art that the circuit components may be replaced under the duality principle as the corresponding voltage edition by the programmable voltage divider and the programmable voltage multiplier.

The electric component measurement apparatus thus constructed has the following effects (1) to (3). (1): Since the current that flows through the capacitor to be measured is standardized within a predetermined value range over the whole varying range of the capacitance of the capacitor, the current based on the capacity component can be substantially absorbed or cancelled so that the loss angle can be apparently expanded likewise over said varying range to measure the loss highly accurately. (2): The feedback circuit of the operational amplifier is not equipped with a plurality of range resistors as is the prior art. (3): Since the capacitance-offset circuit absorbs or cancels the aforementioned standardized current with the identical resolution, the loss angle can be expanded with the same resolution over the whole capacitance range so that the loss resistance can be measured highly accurately.

Figure 1:
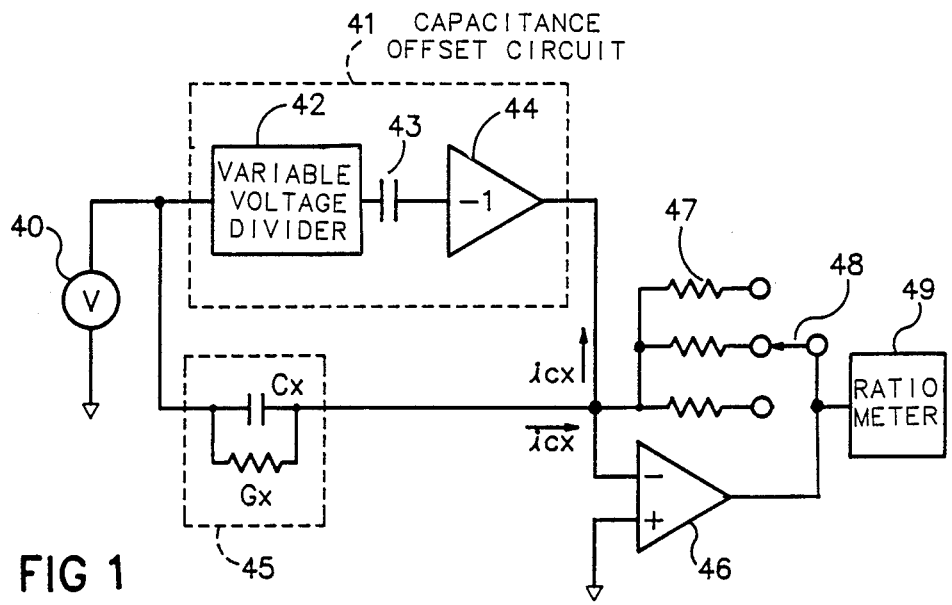
FIG. 1 is a block diagram illustrating prior art.
Figure 2:
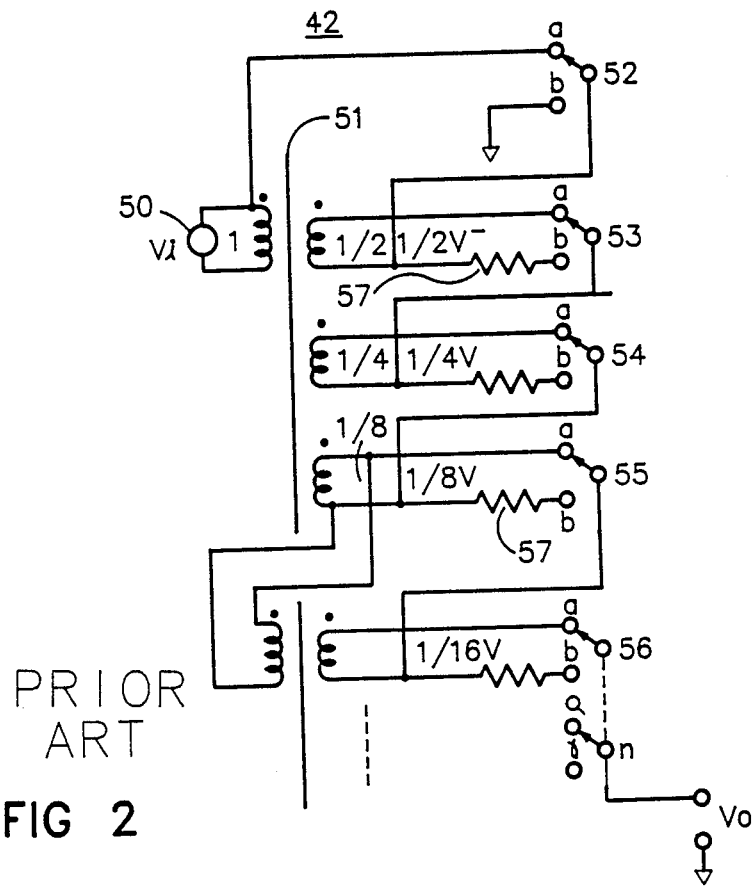
FIG. 2 is a schematic diagram of a prior art voltage divider used in FIG. 1.

As is apparent from FIGS. 1 and 2, moreover, the programmable current transformer to be used in the present invention can have the following effects (1) and (2). (1): No matter which contact a or b of the relay might be connected, the current transformer is connected to the virtual or real ground point so that no characteristic changes, as viewed from the input side, to ensure an excellent linearity between the connection position and the output even with a simple structure. (2): Since the transformer of 1:1 is used, the current division ratio can be made remarkably accurate.

The present invention is therefore highly effective if used for testing the capacitor on the production line.

We claim:

1. An apparatus for providing an indication of the resistive component of the impedance of a capacitor comprising:
    a terminal to which a source of alternating current voltage is to be applied,
    means for coupling a capacitor to be tested to said terminal so as to produce a first signal having resistive and capacitive components corresponding to the resistive and capacitive components of current flowing through the capacitor,
    means coupled to said terminal for producing a second signal that is out of phase with the capacitive component of said first signal,
    a first controllable signal dividing means for supplying at its output a selectable fraction of a signal applied to its input,
    a second controllable signal dividing means for supplying at its output a selectable fraction of a signal applied to its input, said second controllable signal dividing means having its input coupled to receive said second signal,
    an operational amplifier having an inverting input, a non inverting input and an output,
    means for coupling said non inverting input of said amplifier to a point of reference potential,
    a resistor having one end connected to the output of said amplifier and the other end connected to the output of said second signal dividing means,
    switching means for coupling said first signal to said inverting input of said amplifier via said first signal dividing means, said output of said second controllable signal dividing means to said first inverting input of said amplifier and the other end said resistor to said inverting input of said amplifier when in a first position and for coupling said first signal to said inverting input of said amplifier, said first signal dividing means between the other end of said resistor and said inverting input of said amplifier and the output of said second signal dividing means to the junction of said resistor and said first signal dividing means when in a second position,
    said first and second controllable signal dividing means being controlled so that said first and second signals are within the same amplitude range, and
    a phase detector coupled to said source of alternating current voltage and the output of said operational amplifier.

2. Apparatus as set forth in claim 1 wherein said means for producing said first signal and said means for producing said second signal produce signals that are currents.

3. Apparatus for measuring the resistive characteristics of a capacitor comprising:
    a source of alternating current voltage,
    conversion means for converting current to voltage,
    terminals for holding a capacitor to be measured between them,
    coupling means for coupling said terminals between said source of alternating current voltage and said conversion means, thereby conducting a first current to said conversion means when a capacitor to be measured is inserted between said terminals,
    a capacitor,
    a phase inversion means connected in series with said capacitor,
    coupling means for coupling said capacitor and said phase inversion means in series between said source of voltage and said conversion means, thereby conducting a second current to said conversion means that is out of phase with said first circuit,
    current control means included in at least one of said coupling means for maintaining said first and second currents within the same range of amplitudes for a range of values of capacitance of the capacitor being measured, and
    a phase detector coupled to said source of voltage and the voltage provided by said conversion means so as to derive an indication as to the value of resistance in the impedance of a capacitor inserted between said terminals.

4. Apparatus for measuring the resistive characteristic of a capacitor comprising:
    a source of alternating current voltage,
    a pair of terminals between which a capacitor to be measured can be inserted, one of said terminals being coupled to said source of alternating current voltage, a first transformer having a plurality of primary windings connected in series between an input and ground and a plurality of secondary windings having first ends thereof respectively connected to ends of said primary windings that are more remote from ground, a first output lead, switches respectively connected between second ends of said secondary windings and said first output lead, an operational amplifier having an inverting input, a non inverting input connected to ground and an ouput, said first output lead being connected to said inverting input, a capacitor, a phase inverter, a second transformer having a plurality of primary windings connected in series with said capacitor and said phase invertor between said source of alternating current voltage and ground and a plurality of secondary windings having first ends thereof respectively connected to ends of said latter primary windings that are remote from ground, a second output lead, switches respectively connected between the second ends of the latter secondary windings and said second output lead, a resistor connected between the output of said operational amplifier and said second output lead, switching means for connecting said input of said first transformer to the other of said terminals and said first and second output leads to the inverting input of said operational amplifier when in a first position and the input of said first transformer to said second output lead, said other terminal to said inverting input of said operational amplifier, and said first output lead to the inverting input of said amplifier whereby the portion of current that passes through a capacitor inserted between said terminals to the inverting input of said operational amplifier and the current passing through said phase invertor to said inverting input of said operational amplifier can be made to be in the same range of values by operation of said switches, and a phase detector coupled to the output of said operational amplifier and to said source of alternating current voltage for providing an indication as to the resistance in a capacitor inserted between said terminals.

5. Apparatus for providing an indication of the resistive characteristic of a capacitor comprising:

an operational amplifier having an inverting input, a non-inverting input and an output, a ground connection to said non-inverting input, a resistor having one end connected to said output, a source of alternating current voltage, terminals between which a capacitor to be tested is to be inserted, a capacitor and a phase inverter connected in series, a controllable first current divider, a controllable second current divider, means including switches for connecting said first current divider in series with said terminals between said source of alternating current voltage and said inverting input, said second current divider in series with said capacitor, said phase inverter and said inverting input and the other end of said resistor to said inverting input when said switches are in a first position and for connecting said terminals in series with said inverting input, said first current divider between the other end of said resistor and said inverting input and said second current divider in series with said capacitor, phase inverter and the other end of said resistor when in a second position, and a phase detector coupled to said source of alternating current voltage and the output of said amplifier.

* * * * *